United States Patent [19]
Blankenship

[11] Patent Number: 5,680,365
[45] Date of Patent: Oct. 21, 1997

[54] SHARED DRAM I/O DATABUS FOR HIGH SPEED OPERATION

[75] Inventor: Dennis R. Blankenship, Durham, N.C.

[73] Assignee: Mitsubishi Semiconductor America, Inc., Durham, N.C.

[21] Appl. No.: 648,795

[22] Filed: May 16, 1996

[51] Int. Cl.$^6$ .................................................. G11C 8/00
[52] U.S. Cl. ............................ 365/230.05; 365/189.05
[58] Field of Search .......................... 365/230.08, 189.05

[56] References Cited

U.S. PATENT DOCUMENTS

| | | | |
|---|---|---|---|
| 4,700,328 | 10/1987 | Burghard | 365/51 |
| 4,779,145 | 10/1988 | Remington et al. | 360/2 |
| 5,185,724 | 2/1993 | Toda | 365/234 |
| 5,233,558 | 8/1993 | Fuji et al. | 365/189.01 |
| 5,235,552 | 8/1993 | Nakajima et al. | 365/189.05 |
| 5,260,892 | 11/1993 | Testa | 365/63 |
| 5,265,212 | 11/1993 | Bruce, II | 395/325 |
| 5,265,218 | 11/1993 | Testa et al. | 395/325 |
| 5,272,664 | 12/1993 | Alexander et al. | 365/52 |
| 5,289,426 | 2/1994 | Namimoto et al. | 365/230.08 |
| 5,327,390 | 7/1994 | Takasugi | 365/230 |
| 5,329,489 | 7/1994 | Diefendorff | 365/189.05 |
| 5,365,488 | 11/1994 | Matsushita | 365/226 |
| 5,365,489 | 11/1994 | Jeong | 365/230.03 |
| 5,367,488 | 11/1994 | An | 365/189.01 |
| 5,406,527 | 4/1995 | Honma | 365/230.08 |
| 5,416,743 | 5/1995 | Allan et al. | 365/203 |
| 5,418,737 | 5/1995 | Tran | 365/63 |
| 5,430,686 | 7/1995 | Tokami | 365/230.08 |
| 5,446,691 | 8/1995 | North et al. | 365/189.02 |
| 5,548,559 | 8/1996 | Mochizuki et al. | 365/230.08 |

Primary Examiner—David C. Nelms
Assistant Examiner—Michael T. Tran
Attorney, Agent, or Firm—Lowe, Price, LeBlanc & Becker

[57] ABSTRACT

A dual-port semiconductor memory device is formed on a chip and includes a plurality of memory cells arranged in rows and columns, and first and second input/output ports for inputting/outputting data to/from the memory device. Each port includes a data terminal, an input/output circuit for inputting/outputting data from/to the data terminal, a storage buffer connected to the input/output circuit for storing/supplying data from/to the input/output means, and read/write amplifiers connected to the storage buffer for reading data from the memory cell array to the storage buffer and writing data from the storage buffer to the memory cell array. A shared global input/output bus is connected to the read/write amplifiers of the first and second ports, and to the memory cell array.

11 Claims, 4 Drawing Sheets

5,680,365

SHARED DRAM I/O DATABUS FOR HIGH SPEED OPERATION

FIELD OF THE INVENTION

The invention relates generally to a semiconductor memory device, and more particularly, to a dual-port memory.

BACKGROUND OF THE INVENTION

FIG. 1 is a block diagram showing an architecture of a typical dynamic random access memory (DRAM) device formed on a semiconductor chip and having only a single port. The memory device includes a DRAM core 2 and a port 4 formed near an edge of the chip. The DRAM core 2 includes memory array 6 and a plurality of sense amplifiers, however for convenience of explanation, only one sense amplifier is shown as being connected to the memory cell array 6 via bit lines BL, /BL. The memory array 6 has a plurality of memory cells (not shown) arranged in a plurality of rows and columns as is conventional for a DRAM device. A row of memory cells is selected by a row select signal RS provided from a row decoder (not shown) and a column select signal provided from a column decoder (not shown). The column select signal activates transistors 10 and 12 to connect bit lines BL, /BL of a selected column with the input/output buses I/O, /I/O via the sense amplifier 8.

Port 4 includes a terminal pad 14, input buffer 16 for storing data input at terminal pad 14 to be written into the memory device, write amplifier 20 connected to the input buffer 16 via a write bus WB, read amplifier 22 for reading data from selected memory cells of memory array 6, and main amplifier/output driver 18 connected to the read amplifier 22 via read bus RB for outputting the read data to terminal pad 14. The selected memory cells store the data (DA) and complementary data (/DA) of the respective data (DA).

As a way of improving speed and performance of the typical DRAM, a dual port random access memory (RAM) has been developed which enables two separate ports to independently access the memory array. FIG. 2 is a block diagram showing one embodiment of a structure of a conventional dual-port memory formed on a chip 2. In FIG. 2, the dual-port memory has an A port and a B port, and a memory cell array divided into memory cell array 30a and memory cell array 30b, both of which are accessible by ports A and B. In each of the memory cell arrays 30a and 30b are a plurality of word lines and bit lines (not shown) crossing each other, and a memory cell (not shown) is placed at a crossing point of each word line and each bit line. The memory cell array 30a has word line decoder 31a for selecting a row of memory cells in the memory cell array 30a, and the memory cell array 30b has word line decoder 31b for selecting a row of memory cells in the memory cell array 30b.

Shared sense amplifiers 32 are positioned between the memory cell array 30a and the memory cell 30b, and shared column select decoder 46 is position adjacent the memory cell array 30b on a side of the chip 2 adjacent the B port for selecting a column in both memory cell arrays 30a and 30b. Alternatively, the shared column select decoder 46 can be positioned adjacent the memory cell array 30a on a side of the chip 2 adjacent the A port. A storage buffer 42 and read/write amplifiers 44 are provided in common for both the memory cell arrays 30a and 30b. The read write amplifiers 44 are connected to the sense amplifiers 32 via a global bus GB which comprises a GB line and a /GB line. Both ports A and B can access the memory cell arrays 30a and 30b via the global bus GB, the common storage buffer 42 and the common read/write amplifiers 44.

Provided in parallel between the storage buffer 42 and a port A data input/output terminal 34a are tri-state buffer 33a for writing data, and a tri-state buffer 35a for reading data. The tri-stage buffers 33a and 35a are connected to the storage buffer 42 via a read/write bus R/W Bus A. A write enable signal is applied to a control terminal of tri-state buffer 33a through a port A write signal input terminal 36a. The output state of the tri-state buffer 33a is controlled based on the write enable signal. A read enable signal is applied to a control terminal of tri-state buffer 35a through a port A read signal input terminal 38a. Tri-state buffer 35a has its output state controlled based on the read enable signal. Similarly, for the B port, a tri-state buffer 33b for writing data, and a tri-state buffer 35b for reading data are provided in parallel between a sense amplifier 32b and a port B data input/output terminal 34b. The tri-stage buffers 33b and 35b are connected to the storage buffer 42 via a read/write bus R/W Bus B. A write enable signal is applied to a control terminal of tri-state buffer 33b through a port B write signal input terminal 36b. Tri-state buffer 33b has its output state controlled based on the write enable signal. A read enable signal is applied to a control terminal of tri-state buffer 35b through a port B read signal input terminal 38b. Tri-state buffer 35b has its output state controlled based on the read enable signal. Memory cells are selected in the memory arrays 30a and 30b based on address signals applied to DRAM address terminal 48. In the dual port memory shown in FIG. 2, the read and write enable signals applied respectively to the port A read signal input terminal 38a and the port A write signal input terminal 36a, and the read and write enable signals applied respectively to the port B read signal input terminal 38b and the port B write signal input terminal 36b allow independent read and write operations to/from each of the ports A and B.

However, in the dual port memory shown in FIG. 2, the R/W Bus A and the R/W Bus B are generally long compared to the global bus GB which results in increased capacitance on the R/W Bus A and the R/W Bus B. Such increased capacitance is a problem as the need arises to carry out read/write operations at speed which are 150 mHz or greater since increased capacitance tends to slow the speed of the read/write operations. One reason for the long extensions of the R/W Bus A and the R/W Bus B is the placement of the common storage buffer 42 and the read/write amplifiers 44 adjacent the shared sense amplifiers 32. However, placing the common storage buffer 42 and read/write amplifiers 44 closer to the data terminals of the ports A and B would be impractical because of the large size of the global bus GB which typically comprises between about 64 to 256 lines.

Since the conventional dual-port memory has such increased capacitance on the read/write buses, pipeline operations have been necessary to achieve read/write operations at speed which are 150 mHz or greater. However, such pipeline operations causes severe performance degradation because of the extra time that is needed to clear data out of the pipeline when a "miss" occurs.

SUMMARY OF THE INVENTION

It is feature and advantage of the invention to provide a dual-port memory in which the read and write operations can be carried out at high speed.

It is another feature and advantage of the invention to provide a dual-port memory in which the read and write operations are carried out at high speed without using pipeline operations.

A dual port memory formed on a chip in accordance with the present invention comprises a memory cell array including a plurality of memory cells arranged in rows and columns, first and second input/output ports for inputting/outputting data to/from the memory device with each port including a data terminal, input/output means for inputting/outputting data from/to the data terminal, a storage buffer connected to said input/output means for storing/supplying data from/to the input/output means, and read/write amplifiers connected to the storage buffer for reading data from the memory cell array to the storage buffer and writing data from the storage buffer to the memory cell array. A common global input/output bus is connected to the read/write amplifiers of the first and second ports, and to the memory cell array.

In accordance with one aspect of the invention, each port is positioned on an opposing side of the chip.

In accordance with another aspect of the invention the data terminal is positioned at an edge of the chip, the input/output means is positioned near the data terminal, and the storage buffer is positioned near the input/output means.

Still other features and advantages of the present invention will become readily apparent to those skilled in this art from the following detailed description, where only the preferred embodiment of the invention is shown and described, simply by way of illustration of the best mode contemplated of carrying out the invention. As will be realized, the invention is capable of other and different embodiments in various obvious respects, all without departing from the invention. Accordingly, the drawings and description are to be regarded as illustrative in nature, and not as restrictive.

DETAILED DESCRIPTION OF THE DRAWINGS

Figure 1:
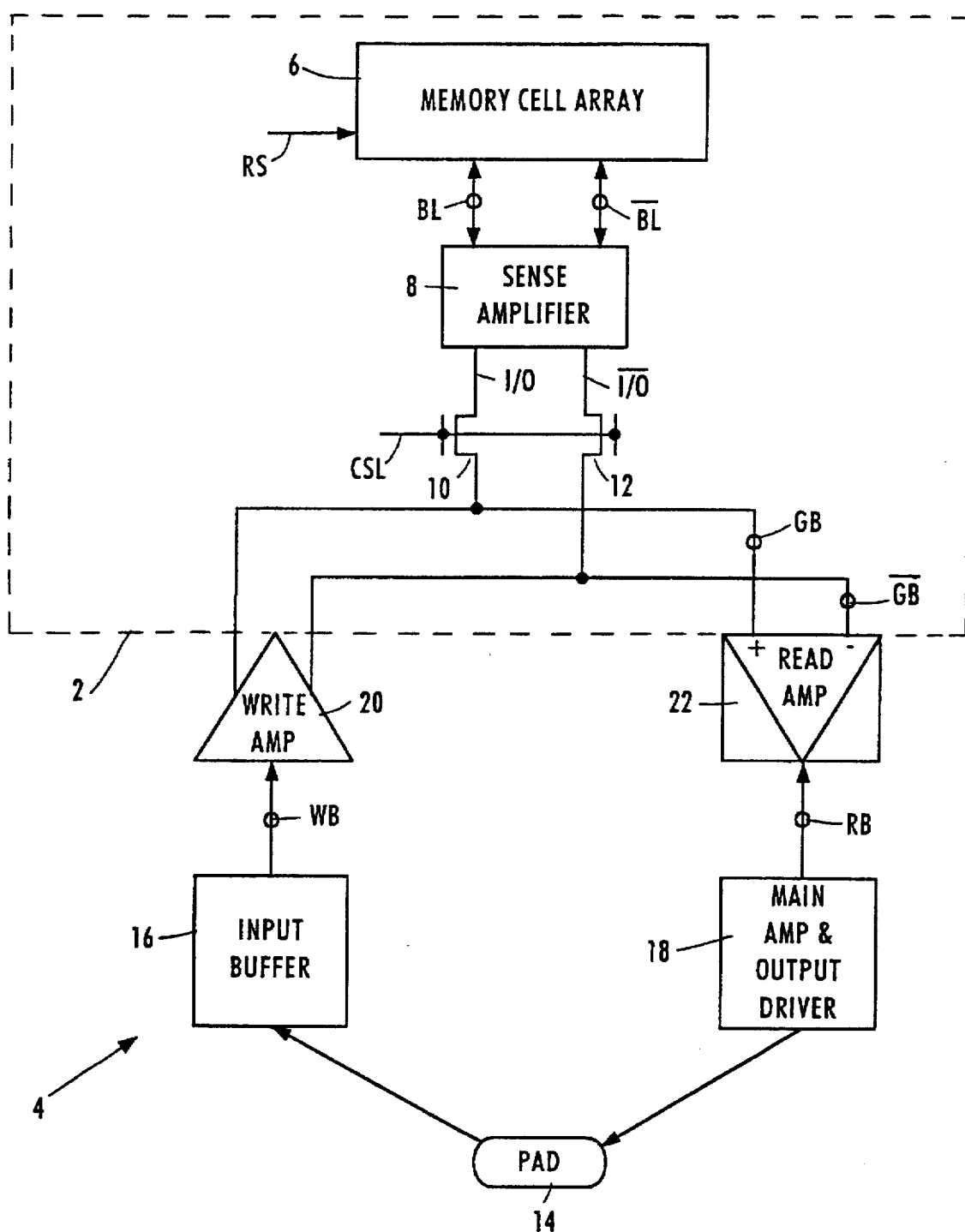
FIG. 1 is a block diagram showing a structure of a typical dynamic random access memory device.
Figure 2:
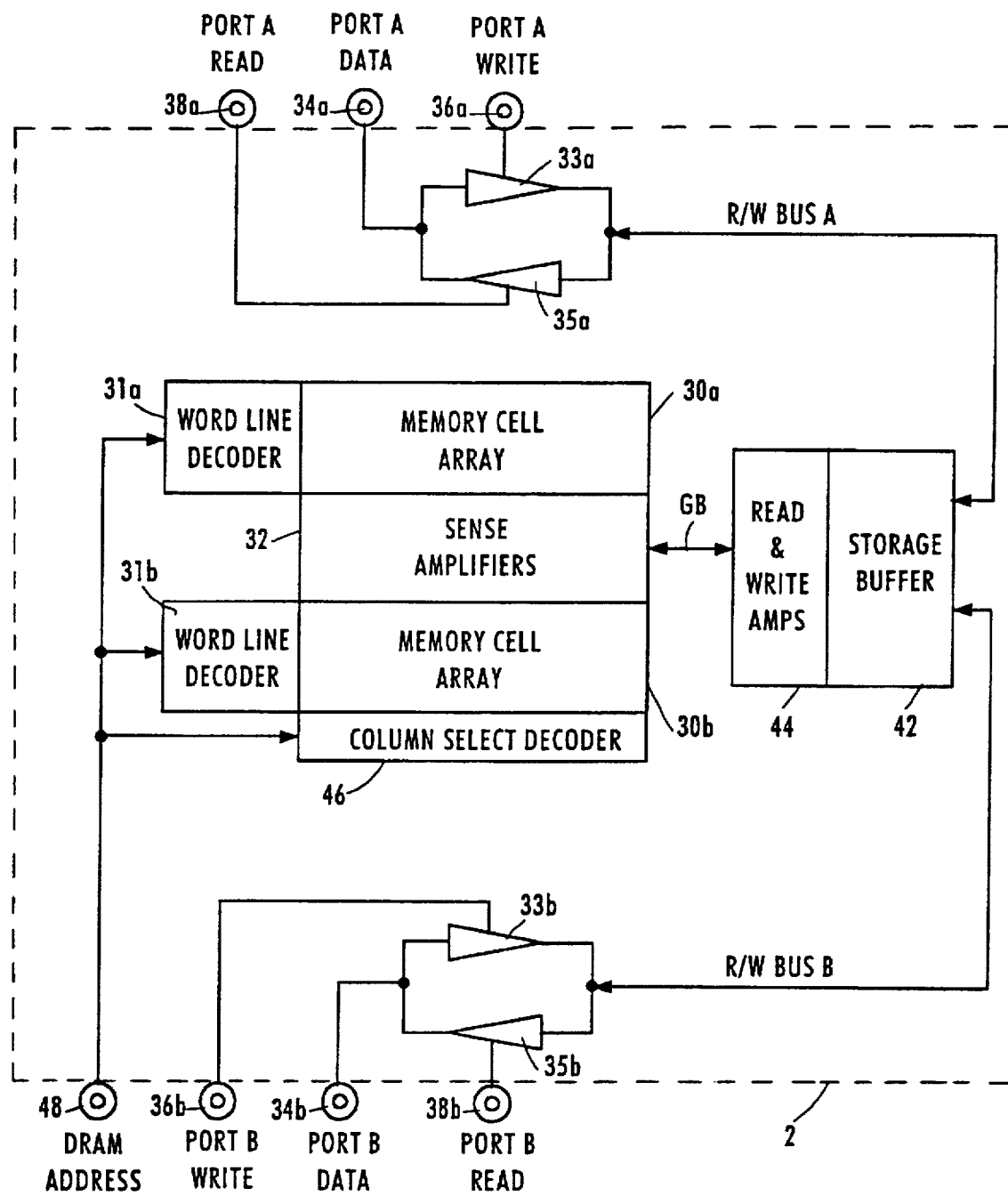
FIG. 2 is a block diagram showing a structure of a conventional dual-port memory formed on a chip.
Figure 3:
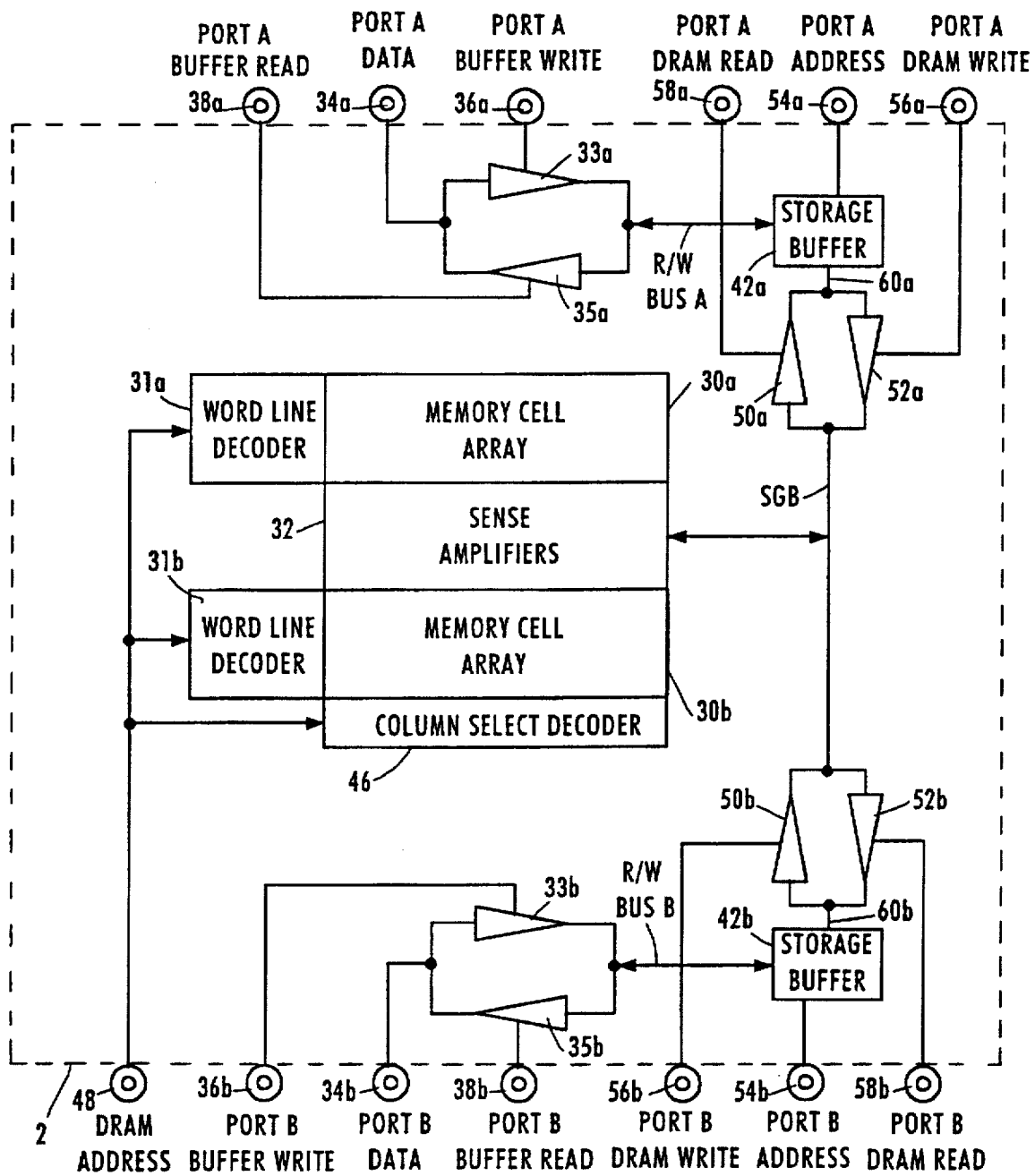
FIG. 3 is a block diagram showing a structure of the dual-port memory formed on a chip in accordance with the present invention.

FIG. 3 is a block diagram showing a structure of a dual-port memory in accordance with the present invention. The dual-port memory shown in FIG. 3 is substantially identical to the structure of the conventional dual-port memory shown in FIG. 2, with essentially only the following differences. The same reference characters denote the same or corresponding portions, and description thereof will not be provided.

In FIG. 3, port A has a storage buffer 42a, a tri-state amplifier 50a and a tri-state amplifier 52a positioned near the edge of the chip 2 on the A port side. Port B has a storage buffer 42b, a tri-state amplifier 50b and a tri-state amplifier 52b positioned near the edge of the chip 2 on the B port side. A bus 60a connects storage buffer 42a with the tri-state amplifier 50a and the tri-state amplifier 52a. A bus 60b connects storage buffer 42b with the tri-state amplifier 50b and the tri-state amplifier 52b. Tri-state amplifier 50a and tri-state amplifier 52a are connected to tri-state amplifier 50b and tri-state amplifier 52b via shared global bus SGB which is also connected to the sense amplifiers 32. Tri-state amplifier 50a and 52a and tri-state amplifier 50b and 52b are connected in parallel between respective storage buffers 42a, 42b and the shared global bus SGB.

A DRAM write enable signal is applied to a control terminal of tri-state amplifier 52a through a port A DRAM write signal input terminal 56a. The output state of the tri-state amplifier 52a is controlled based on the DRAM write enable signal. A read enable signal is applied to a control terminal of tri-state amplifier 50a through a port A DRAM read signal input terminal 58a. Tri-state amplifier 50a has its output state controlled based on the DRAM read enable signal. Similarly, for the B port, a write enable signal is applied to a control terminal of tri-state amplifier 50b through a port B DRAM write signal input terminal 56b. Tri-state amplifier 50b has its output state controlled based on the DRAM write enable signal. A DRAM read enable signal is applied to a control terminal of tri-state amplifier 52b through a port B DRAM read signal input terminal 58b. Tri-state amplifier 52b has its output state controlled based on the DRAM read enable signal. Operation of storage buffer 42a is controlled by a port A address signal applied to port A address terminal 54a, and operation of storage buffer 42b is controlled by a port B address signal applied to port B address terminal 54b.

As is shown in FIG. 3, each of the read/write buses R/W Bus A and R/W Bus B has a shorter length than the R/W Bus A and R/W bus B of the conventional dual-port memory shown in FIG. 2. By reducing the length of the read/write buses, capacitance of the R/W Bus A and the R/W Bus B is reduced. By reducing the capacitance of the read/write buses, the speed of the read operation and write operation will be faster than in the conventional dual-port memory. In particular, the read operations and write operations can have speeds of 150 mHz or more without pipeline operations.

Figure 4:
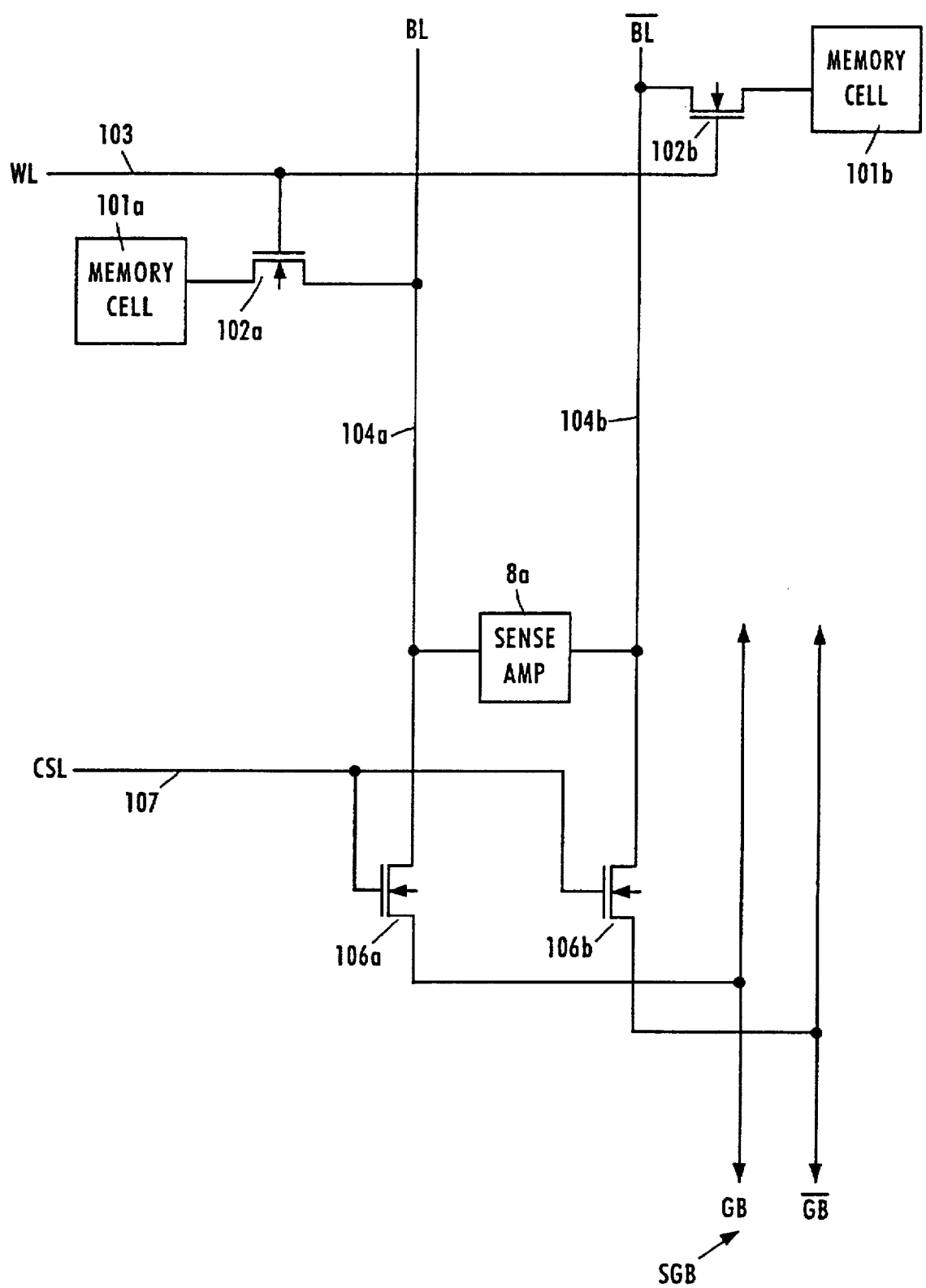
FIG. 4 is a circuit diagram partially showing the internal structure of a memory cell array in the dual-port memory shown in FIG. 3.

FIG. 4 is a diagram shown an input/output structure for one memory cell in either memory cell array 31a or 31b shown in FIG. 3. In either memory cell array 31a or 31b, a plurality of memory cells 101a and 101b are disposed in a matrix of rows and columns. As shown in FIG. 4, a word line (WL) 103 is provide for each row and the memory cells 101a and 101b are connected to the word line 103 via transfer gate transistor 102a and 102b. Each column is comprised of a bit line pair BL 104a and /BL 104b. A column select line (CSL) 107 is connected to the column select transistors 106a and 106b. Each of the select transistors 106a and 106b have one conductor connected to sense amplifier 8a and another conductor connected to the respect lines GB, /GB of the shared global bus SGB. Thus, when word line 103 and column selection line 107 are selected, complementary data stored in memory cells 101a and 101b are read out to the shared global bus lines GB, /GB.

In the dual-port memory shown in FIGS. 3 and 4, typically the shared global bus SGB is 256 bits wide while the lines connecting the data terminals of each port to the storage buffers via the tri-state buffers 33a, 35a or 33b, 35b are 16 bits wide. With the arrangement of the present invention, the large, slow speed, shared global bus SGB can be used to fill storage buffers 42a and 42b which can be read and written at very high speeds. In addition, data can be read out of the memory cell arrays 30a, 30b to the storage buffers 42a, 42b either selectively or simultaneously, and can be read out of storage buffers 42a, 42b to respective data input/output terminals 34a, 34b either selectively or simultaneously.

Since the storage buffers 42a and 42b share the shared global bus SGB, it is not possible for both the storage buffers 42a, 42b to simultaneously access memory cell arrays 31a, 31b to write data. However, with the arrangement of the present invention it is possible to write data from the respective data input/output terminals 34a, 34b to the corresponding storage buffers 42a, 42b either selectively or simultaneously while scheduling writing from the storage buffers 42a, 42b to the memory arrays 31a, 31b to avoid data collision. Since storage buffers 42a, 42b can be designed to hold a plurality of data blocks, with each data block having 256 bits, for example, speed of writing to the dual-port memory can be increased by filling the data blocks with data written from data input/output terminals 34a, 34b and scheduling a later access from the storage buffers 42a, 42b to the memory arrays 31a, 31b. In addition, with the arrangement of the present invention, it is possible to speed operations by writing data to the storage buffer 42a or 42b from the respective input/output terminals 34a, 34b while writing data from storage buffer 42b or 42a to the memory arrays 31a, 31b. Such operation is not possible with the conventional dual-port memory shown in FIG. 2 since the common storage buffer is provided for both ports A and B. Alternatively, data can be read from the storage buffer 42a or 42b to the respective input/output terminals 34a, 34b while writing data from storage buffer 42b or 42a to the memory arrays 31a, 31b. Such operation is not possible also with the conventional dual-port memory shown in FIG. 2 since the common storage buffer is provided for both ports A and B.

There accordingly has been described a dual-port memory in which the read and write operations can be carried out at high speed.

The many features and advantages of the invention are apparent from the detailed specification, and thus, it is intended by the appended claims to cover all such features and advantages of the invention which fall within the true spirit and scope of the invention. Since numerous modifications and variations will readily occur to those skilled in the art, it is not desired to limit the invention to the exact construction and operation illustrated and described, and accordingly, all suitable modifications and equivalents may be resorted to, falling within the scope of the invention.

What is claimed is:

1. A dual-port semiconductor memory device formed on a chip, comprising:

a memory cell array including a plurality of memory cells arranged in rows and columns;

first and second input/output ports for inputting/outputting data to/from the memory device, each port including a data terminal, input/output buffers for inputting/outputting data from/to the data terminal, a storage buffer for storing data input from the input/ouput buffers and data to be output to the input/output buffers, the storage buffer having first and second bi-directional conductors, the first bi-directional conductor being connected to said input/output buffers for providing data from the input/output buffers to the storage buffer and from the storage buffer to the input/output buffers, and read/write amplifiers for reading data from the memory cell array and writing data to the memory cell array, said second bi-directional conductor of the storage buffer being connected to said read/write amplifiers and providing read data from the read/write amplifiers to the storage buffer and write data from the storage buffer to the read/write amplifiers; and a shared global input/output bus connected to the read/write amplifiers of the first and second ports, and to the memory cell array.

2. The semiconductor memory device of claim 1, wherein each port is position on an opposing side of said chip.

3. The semiconductor memory device of claim 1, wherein, for each port the data terminal is positioned at an edge of the chip, the input/output buffers are positioned near the data terminal, and the storage buffer is positioned near the input/output buffers.

4. The semiconductor memory device of claim 1, further comprising a plurality of sense amplifiers, wherein the shared global input/output bus is connected to the plurality of sense amplifiers.

5. A dual-port semiconductor memory device formed on a chip, comprising:

a memory cell array including a plurality of memory cells arranged in rows and columns, and divided into a plurality of memory portions;

selection means for selecting a memory cell in one of the plurality of memory portions based on address data supplied to an address terminal of the chip;

first and second input/output ports for inputting/outputting data to/from the selected memory cell, each port including a data terminal, input/output buffers for inputting/outputting data from/to the data terminal, a storage buffer for storing data input from the input/ouput buffers and data to be output to the input/output buffers, the storage buffer having first and second bi-directional conductors, the first bi-directional conductor being connected to said input/output buffers for providing data from the input/output buffers to the storage buffer and from the storage buffer to the input/output buffers, and read/write amplifiers for reading data from the memory cell array and writing data to the memory cell array, said second bi-directional conductor of the storage buffer being connected to said read/write amplifiers and providing read data from the read/write amplifiers to the storage buffer and write data from the storage buffer to the read/write amplifiers; and a shared global input/output bus connected to the read/write amplifiers of the first and second ports, and to the memory cell array.

6. The semiconductor memory device of claim 5, wherein each port is position on an opposing side of said chip.

7. The semiconductor memory device of claim 5, wherein, for each port the data terminal is positioned at an edge of the chip, the input/output buffers are positioned near the data terminal, and the storage buffer is positioned near the input/output buffers.

8. The semiconductor memory device of claim 5, further comprising a plurality of sense amplifiers connected to the plurality of memory cells of the memory cell array and positioned between the plurality of memory portions, wherein the shared global input/output bus is connected to the plurality of sense amplifiers.

9. The semiconductor memory device of claim 8, wherein,
each storage buffer can receive data either selectively or simultaneously from the selected memory cell via the shared global input/output bus during a read operation, and one of the storage buffers can write data to the selected memory cell via the shared global input/output bus during a write operation while data is written to the other storage buffer from the corresponding data terminal.

10. The semiconductor memory device of claim 8, wherein,
each storage buffer can receive data either selectively or simultaneously from the selected memory cell via the shared global input/output bus during a read operation, and one of the storage buffers can write data to the selected memory cell via the shared global input/output bus during a write operation while data is read from the other storage buffer from the corresponding data terminal.

11. The semiconductor memory device of claim 8, wherein, data can be selectively or simultaneously written to/read from the storage buffer of each port from/to the respective data terminal.

* * * * *